US008828873B2

(12) United States Patent
Shimoi et al.

(10) Patent No.: US 8,828,873 B2
(45) Date of Patent: Sep. 9, 2014

(54) METHOD FOR MANUFACTURING SEMICONDUCTOR DEVICE

(75) Inventors: Hideki Shimoi, Hamamatsu (JP); Keisuke Araki, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/388,626

(22) PCT Filed: Jul. 19, 2011

(86) PCT No.: PCT/JP2011/066347
§ 371 (c)(1),
(2), (4) Date: Feb. 2, 2012

(87) PCT Pub. No.: WO2012/014717
PCT Pub. Date: Feb. 2, 2012

(65) Prior Publication Data
US 2012/0135602 A1    May 31, 2012

(30) Foreign Application Priority Data

Jul. 26, 2010   (JP) ................................. 2010-167396

(51) Int. Cl.
*H01L 21/302*   (2006.01)
*H01L 23/473*   (2006.01)
*B23K 26/06*    (2014.01)
*B23K 26/00*    (2014.01)
*B23K 26/08*    (2014.01)

(52) U.S. Cl.
CPC ............ *B23K 26/006* (2013.01); *H01L 23/473* (2013.01); *B23K 26/063* (2013.01); *B23K 26/0042* (2013.01); *B23K 26/0853* (2013.01); *B23K 2201/40* (2013.01)
USPC .................................. 438/689; 257/E21.214

(58) Field of Classification Search
None
See application file for complete search history.

(56) References Cited

U.S. PATENT DOCUMENTS

| 4,450,472 A | * | 5/1984 | Tuckerman et al. | .......... 257/713 |
| 5,106,764 A | * | 4/1992 | Harriott et al. | ............... 438/694 |
| 5,801,442 A | * | 9/1998 | Hamilton et al. | ............. 257/714 |

(Continued)

FOREIGN PATENT DOCUMENTS

| CN | 101097897 | 1/2008 |
| JP | 4-150212 | 5/1992 |

(Continued)

OTHER PUBLICATIONS

M. Watanabe, et al., "Femtosecond laser-assisted three-dimensional microfabrication in silica", Mar. 1, 2001, Optics Letters, vol. 26, No. 5, p. 277-279.

*Primary Examiner* — Allan Olsen
(74) *Attorney, Agent, or Firm* — Drinker Biddle & Reath LLP

(57) ABSTRACT

A method for manufacturing a semiconductor device having a cooling mechanism comprises a modified region forming step of converging a laser light at a sheet-like object to be processed made of silicon so as to form a modified region within the object along a line to form a modified region, an etching step of anisotropically etching the object after the modified region forming step so as to advance the etching selectively along the first modified region and form a flow path for circulating a coolant as a cooling mechanism within the object, and a functional device forming step of forming a functional device on one main face side of the object.

12 Claims, 16 Drawing Sheets

(56) References Cited

U.S. PATENT DOCUMENTS

| | | | |
|---|---|---|---|
| 6,156,273 A * | 12/2000 | Regnier et al. | 422/70 |
| 6,692,700 B2 * | 2/2004 | Handique | 422/503 |
| 6,991,024 B2 * | 1/2006 | Goodson et al. | 165/80.4 |
| 6,992,026 B2 | 1/2006 | Fukuyo et al. | |
| 7,000,684 B2 * | 2/2006 | Kenny et al. | 165/80.4 |
| 7,033,519 B2 | 4/2006 | Taylor et al. | |
| 7,704,684 B2 * | 4/2010 | Rogers et al. | 430/325 |
| 8,071,277 B2 * | 12/2011 | Porque | 430/325 |
| 2005/0124712 A1 * | 6/2005 | Anderson et al. | 522/1 |
| 2005/0193771 A1 * | 9/2005 | Miura et al. | 65/33.2 |
| 2005/0199592 A1 * | 9/2005 | Iri et al. | 219/121.6 |
| 2005/0272223 A1 | 12/2005 | Fujii et al. | |
| 2006/0108338 A1 | 5/2006 | Nishiwaki et al. | |
| 2006/0121697 A1 * | 6/2006 | Fujii et al. | 438/460 |
| 2006/0148212 A1 * | 7/2006 | Fukuyo et al. | 438/463 |
| 2008/0032237 A1 * | 2/2008 | Wong et al. | 430/321 |
| 2008/0090382 A1 * | 4/2008 | Fujii et al. | 438/463 |
| 2008/0115916 A1 * | 5/2008 | Schuette | 165/104.33 |
| 2008/0128391 A1 * | 6/2008 | Wong et al. | 216/48 |
| 2009/0039559 A1 * | 2/2009 | Kuno et al. | 264/400 |
| 2010/0006548 A1 * | 1/2010 | Atsumi et al. | 219/121.72 |
| 2010/0136766 A1 * | 6/2010 | Sakamoto et al. | 438/463 |
| 2011/0306182 A1 * | 12/2011 | Fukuyo et al. | 438/460 |
| 2012/0077315 A1 * | 3/2012 | Fukumitsu et al. | 438/114 |
| 2012/0329248 A1 * | 12/2012 | Fukuyo et al. | 438/463 |
| 2013/0015167 A1 * | 1/2013 | Fujii et al. | 219/121.68 |
| 2013/0029092 A1 * | 1/2013 | Wakioka | 428/131 |
| 2013/0029093 A1 * | 1/2013 | Wakioka | 428/131 |

FOREIGN PATENT DOCUMENTS

| | | |
|---|---|---|
| JP | 2873937 | 1/1999 |
| JP | 2001-15675 | 1/2000 |
| JP | 2000-246475 | 9/2000 |
| JP | 2002-210730 | 7/2002 |
| JP | 2004-128445 | 4/2004 |
| JP | 2004-136358 | 5/2004 |
| JP | 2004-160618 | 6/2004 |
| JP | 2004-223586 | 8/2004 |
| JP | 2004-304130 | 10/2004 |
| JP | 2004-351494 | 12/2004 |
| JP | 2004-359475 | 12/2004 |
| JP | 2005-74663 | 3/2005 |
| JP | 2005-121915 | 5/2005 |
| JP | 2005-121916 | 5/2005 |
| JP | 2005-144586 | 6/2005 |
| JP | 2005-144622 | 6/2005 |
| JP | 2005-152693 | 6/2005 |
| JP | 2005-206401 | 8/2005 |
| JP | 2005-208175 | 8/2005 |
| JP | 2005-306702 | 11/2005 |
| JP | 2005-351774 | 12/2005 |
| JP | 2006-167804 | 6/2006 |
| JP | 2006-176355 | 7/2006 |
| JP | 2006-290630 | 10/2006 |
| JP | 2007-36758 | 2/2007 |
| JP | 2007-101833 | 4/2007 |
| JP | 2008-112749 | 5/2008 |
| JP | 2010-142837 | 7/2010 |
| JP | 2010-155259 | 7/2010 |
| WO | WO 00/50198 | 8/2000 |

\* cited by examiner (a)

(b)

(a)

(b)

(c)

(a)

(b)

(c)

(d)

(a)

(b)

(c)

(d)

(a)

(b)

METHOD FOR MANUFACTURING SEMICONDUCTOR DEVICE

TECHNICAL FIELD

The present invention relates to a method for manufacturing a semiconductor device and, in particular, to a method for manufacturing a semiconductor device having a cooling mechanism.

BACKGROUND ART

Conventionally known as a method for manufacturing a semiconductor device having a cooling mechanism is one comprising mounting functional devices such as semiconductor chips on a substrate, sealing the substrate with a thermally conductive resin, and mounting a cooling fin thereon as disclosed in Patent Literature 1, for example. In the manufacturing method disclosed in Patent Literature 1, depths of grooves of the cooling fin are adjusted according to amounts of heat generation of the functional devices.

CITATION LIST

Patent Literature

Patent Literature 1: Japanese Patent Application Laid-Open No. 2001-15675

SUMMARY OF INVENTION

Technical Problem

The above-mentioned prior art is required to provide indirect cooling means such as a cooling fin which is larger than the functional devices and thus may become bulky and lower the cooling efficiency. This becomes remarkable when manufacturing high-output semiconductor devices.

It is therefore an object of the present invention to provide a method for manufacturing a semiconductor device which can manufacture a semiconductor device capable of improving the cooling efficiency and reducing the size.

Solution to Problem

For achieving the above-mentioned object, the method for manufacturing a semiconductor device in accordance with one aspect of the present invention is a method for manufacturing a semiconductor device having a cooling mechanism, the method comprising a modified region forming step of converging a laser light at a sheet-like object to be processed made of silicon so as to form a first modified region within the object along a line to form a modified region, an etching step of anisotropically etching the object after the modified region forming step so as to advance the etching selectively along the first modified region and form a flow path for circulating a coolant as a cooling mechanism within the object, and a functional device forming step of forming a functional device on one main face side of the object.

This semiconductor device manufacturing method can integrally form a flow path for circulating a coolant within a object to be processed, thereby yielding a semiconductor device which can be cooled directly without separately providing cooling means. That is, a semiconductor device capable of improving the cooling efficiency and reducing the size can be manufactured.

The method for manufacturing a semiconductor device in accordance with another aspect of the present invention is A method for manufacturing a semiconductor device having a cooling mechanism, the method comprising a modified region forming step of converging a laser light at a sheet-like object to be processed made of silicon so as to form a first modified region within the object along a line to form a modified region, an etching step of anisotropically etching the object after the modified region forming step so as to advance the etching selectively along the first modified region and form a space for filling with a coolant within the object, a step of forming a cooling mechanism in the object so as to fill the space with the coolant, and a functional device forming step of forming a functional device on one main face side of the object.

This semiconductor device manufacturing method can integrally form a cooling mechanism within an object to be processed so as to form a space within the object and fill the space with a coolant, thereby yielding a semiconductor device which can be cooled directly without separately providing cooling means. That is, a semiconductor device capable of improving the cooling efficiency and reducing the size can be manufactured.

The modified region forming step may form a second modified region exposed to the other main face opposite from the one main face in the object along a thickness direction of the object such that the second modified region is continuous with the first modified region in the middle thereof, and the etching step may advance the etching selectively along the second modified region so that an etchant proceeds from the second modified region to the first modified region. In this case, when forming the flow path by advancing the etching along the first modified region, the advancement of the etching in the first modified region can be controlled by the second modified region as desired.

Here, the method may further comprise a step of closing a hole formed by advancing the etching along the second modified region. The functional device forming step may be performed after the etching step.

Advantageous Effects of Invention

The present invention can easily manufacture a semiconductor device capable of improving the cooling efficiency and reducing the size.

DESCRIPTION OF EMBODIMENTS

In the following, preferred embodiments of the present invention will be explained in detail with reference to the drawings. In the following explanation, the same or equivalent constituents will be referred to with the same signs while omitting their overlapping descriptions.

The method for manufacturing a semiconductor device in accordance with an embodiment converges a laser light into a object to be processed, so as to form a modified region. Therefore, the forming of the modified region will firstly be explained in the following with reference to FIGS. 1 to 6.

Figure 1:
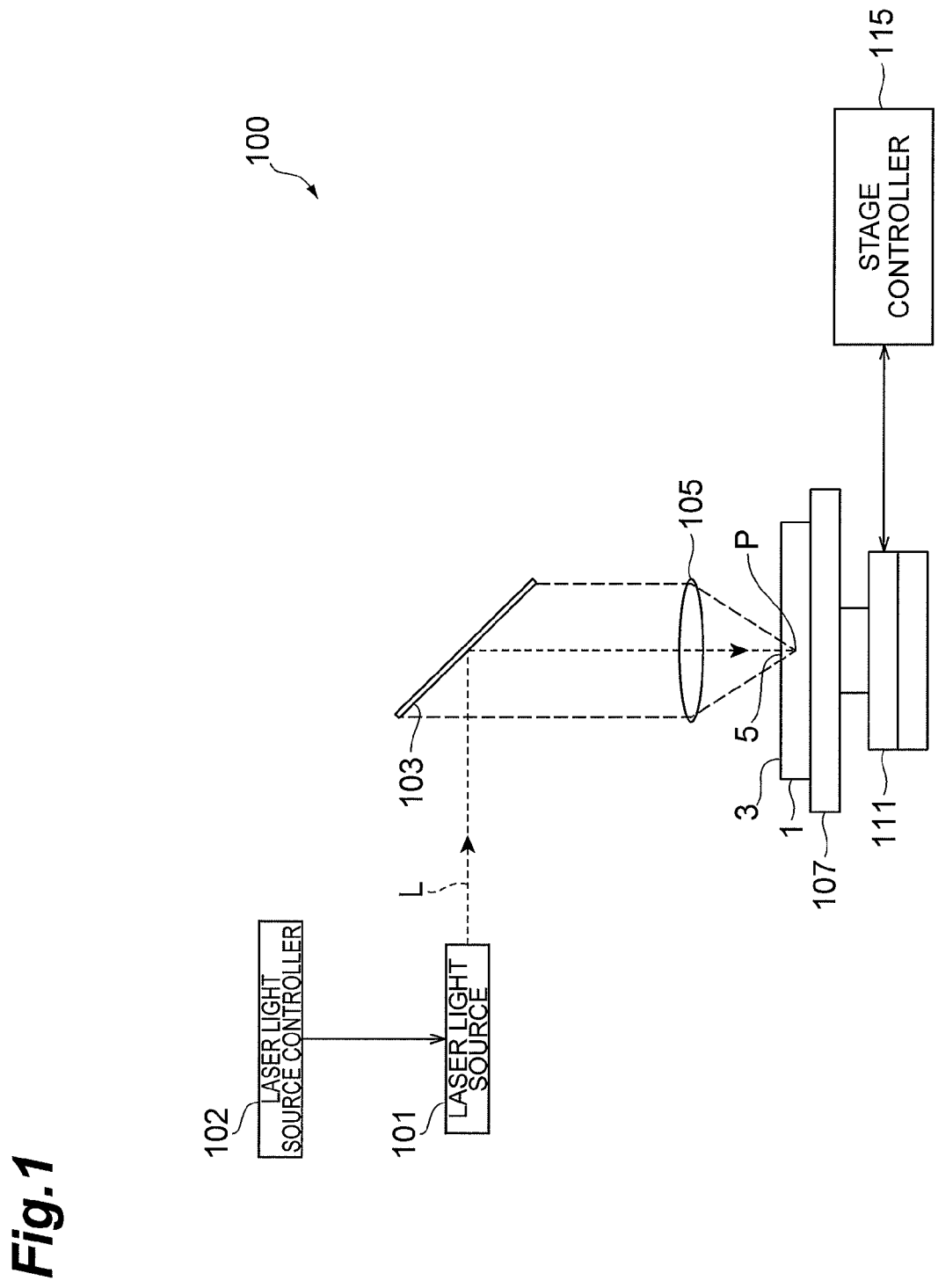
FIG. 1 is a schematic structural diagram of a laser processing device used for forming a modified region.

As illustrated in FIG. 1, a laser processing device 100 comprises a laser light source 101 which causes a laser light L to oscillate in a pulsating manner, a dichroic mirror 103 arranged such as to change the direction of the optical axis (optical path) of the laser light L by 90°, and a condenser lens 105 for converging the laser light L. The laser processing device 100 also comprises a support table 107 for supporting an object to be processed 1 irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line to form a modified region 5. This forms a modified region in the object 1 along the line 5.

Figure 2:
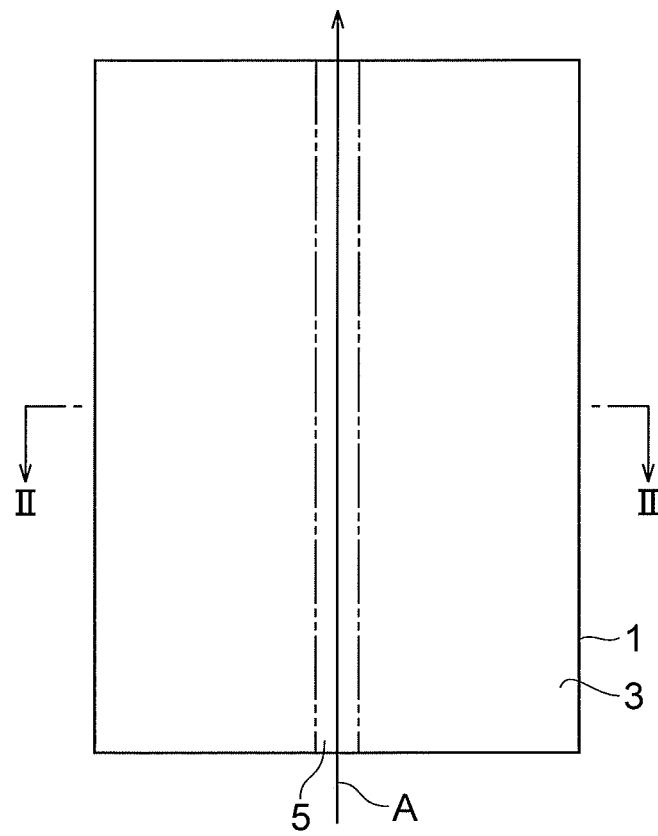
FIG. 2 is a plan view of the object in which the modified region is to be formed.
Figure 3:
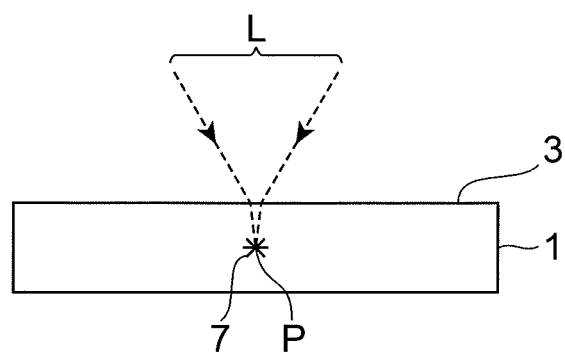
FIG. 3 is a sectional view of the object taken along the line III-III of FIG. 2.
Figure 4:
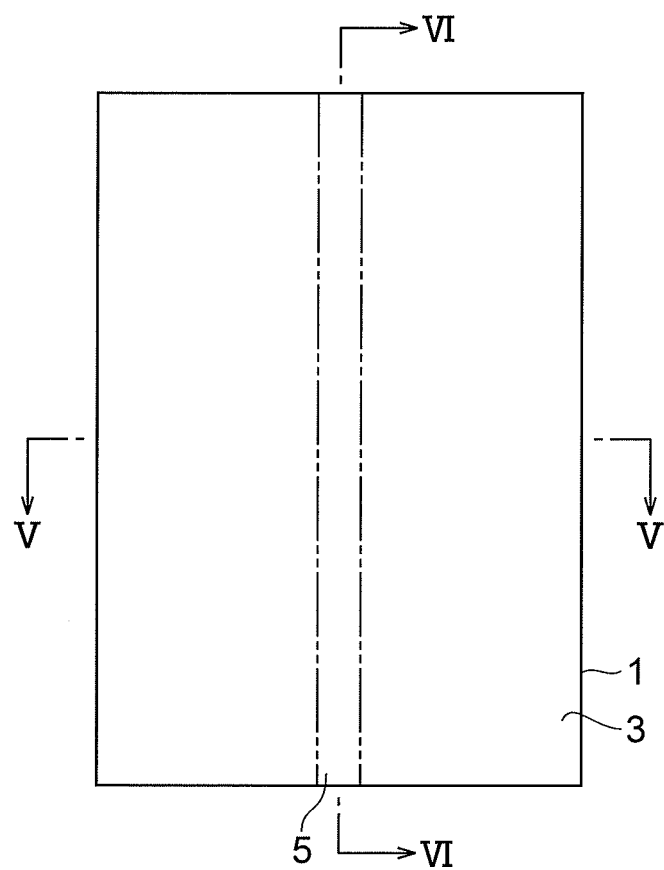
FIG. 4 is a plan view of the object after laser processing.
Figure 5:
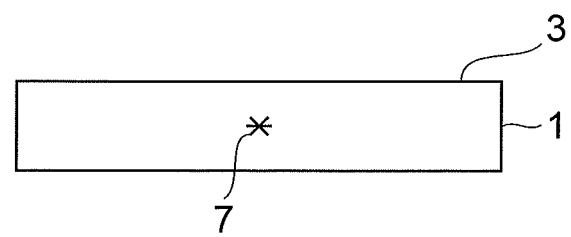
FIG. 5 is a sectional view of the object taken along the line V-V of FIG. 4.
Figure 6:
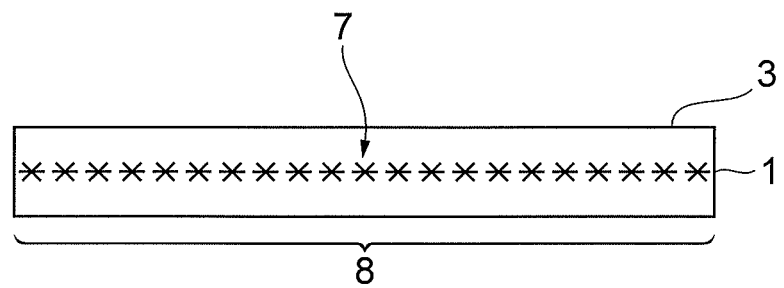
FIG. 6 is a sectional view of the object taken along the line VI-VI of FIG. 4.

As illustrated in FIG. 2, the line 5 is set in the object 1, for which a semiconductor material, a piezoelectric material, or the like is used. Here, the line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 becomes a removing region 8 to be removed by etching which will be explained later.

The converging point P is a position at which the laser light L is converged. The line 5 may be curved instead of being straight, shaped into a three-dimensional form combining them, or specified in terms of coordinates. The modified region 7 may be formed either continuously or intermittently. The modified region 7 may be formed like lines or dots. It will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., internal absorption type laser processing). In the case of forming a removing part such as a hole or groove by melting it away from the front face 3 (surface absorption type laser processing), the processing region gradually progresses from the front face 3 side to the rear face side in general.

The modified region 7 in accordance with this embodiment means regions whose physical characteristics such as density, refractive index, and mechanical strength have attained states different from those of their surroundings. Examples of the modified region 7 include molten processed regions, crack regions, dielectric breakdown regions, refractive index changed regions, and their mixed regions. Further examples of the modified region 7 include an area where the density has changed from that of an unmodified region in a material of the object 1 and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region 7 or in only a part or a plurality of parts thereof. Examples of the object 1 include those containing or constituted by silicon.

Here, this embodiment forms the modified region 7 in the object 1 and then etches the object 1, so as to advance the etching selectively along the modified region 7 (i.e., along the modified region 7, fractures included in the modified region 7, or fractures from the modified region 7), thereby removing a part extending along the modified region 7 in the object 1. These fractures are also known as cracks, microcracks, fractures, and the like (hereinafter simply referred to as "fractures").

In the etching in this embodiment, for example, a capillary action or the like is utilized so that fractures included in the modified region 7 of the object 1 or fractures extending from the modified region 7 are impregnated with an etchant, so as to advance the etching along fracture surfaces. This advances the etching selectively at a higher etching rate along the fractures in the object 1 and removes them. Also, by utilizing the characteristic feature that the etching rate of the modified region 7 itself is high, the etching is selectively advanced along the modified region 7, so as to remove it.

Examples of the etching include a case where the object 1 is immersed in the etchant (dipping) and a case where the object 1 is coated with the etchant while being rotated (spin etching). The etching herein includes isotropic etching and anisotropic etching.

Examples of the etchant include KOH (potassium hydroxide), TMAH (aqueous tetramethylammonium hydroxide solution), EDP (ethylenediamine pyrocatechol), NaOH (sodium hydroxide), CsOH (cesium hydroxide), $NH_4OH$ (ammonium hydroxide), and hydrazine. The etchant to be used is not limited to liquids but may be in the form of a gel (jelly or semisolid). Here, the etchant is used at a temperature ranging from ambient temperature to about 100° C., which is set appropriately according to a required etching rate or the like. When etching the object 1 made of silicon with KOH, for example, the temperature is preferably about 60° C.

As the etching, this embodiment performs anisotropic etching which is etching having a higher (or lower) etching rate in a specific direction. The anisotropic etching is applicable not only to relatively thin objects but also to thick ones (having a thickness of 800 μm to 100 μm, for example). In this case, even when the surface to be formed with the modified region 7 differs from its plane direction, the etching can be advanced along the modified region 7. That is, the anisotropic etching here enables not only the etching of the plane direction in conformity to the crystal orientation, but also the etching independent of the crystal orientation.

Figure 7:
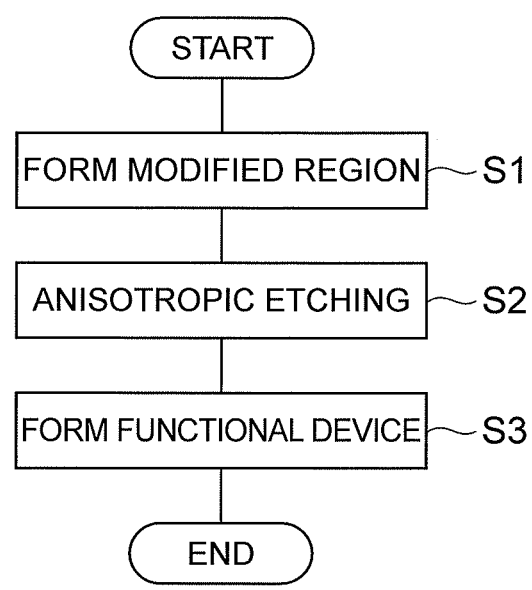
FIG. 7 is a flowchart illustrating the method for manufacturing a semiconductor device in accordance with a first embodiment.

The semiconductor device manufacturing method in accordance with the first embodiment will now be explained in detail. FIG. 7 is a flowchart illustrating this embodiment, while FIGS. 8 to 13 are flow diagrams for explaining this embodiment.

Figure 10:
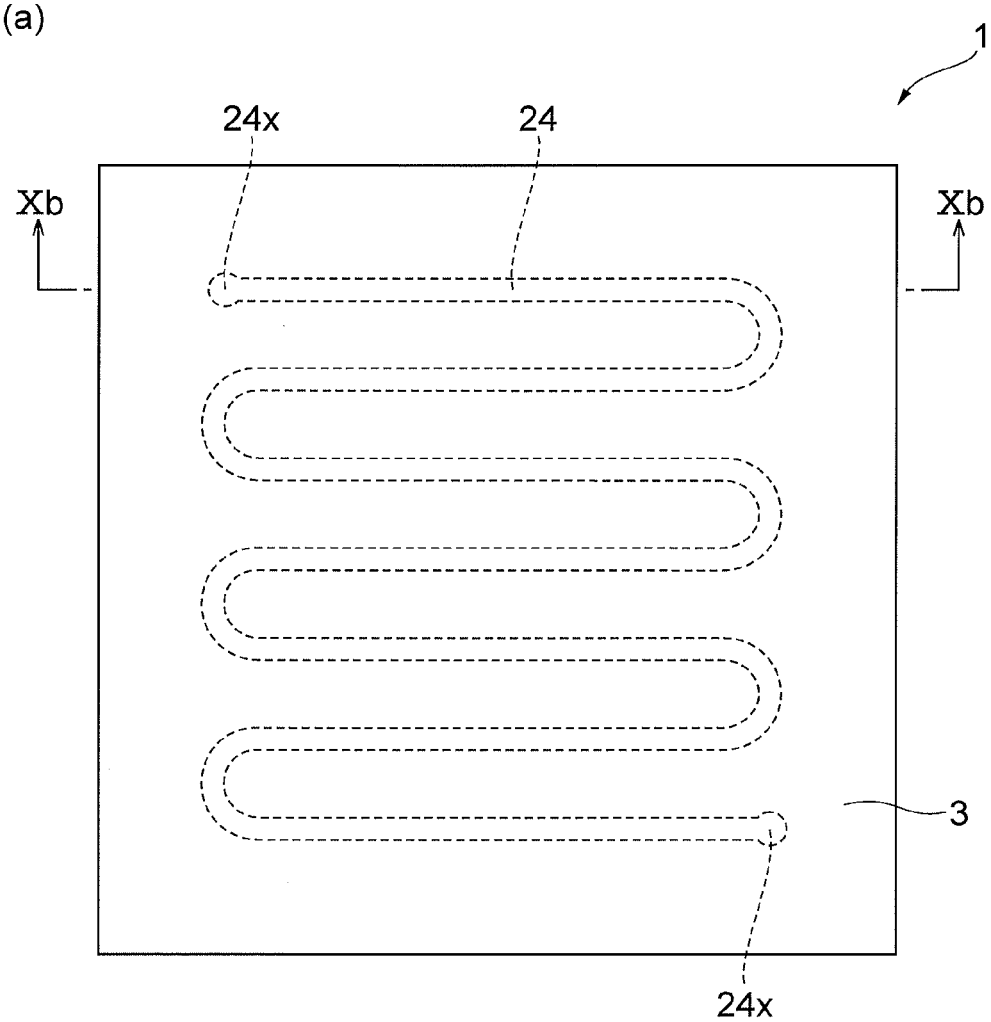
FIG. 10 (a) is a plan view of the object illustrating a sequel to FIG. 9(c), while (b) is a sectional view of the object taken along the line Xb-Xb of FIG. 10(a)
Figure 10:
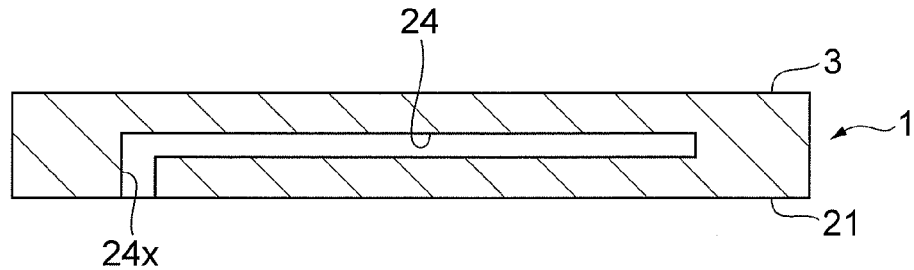
Figure 11:
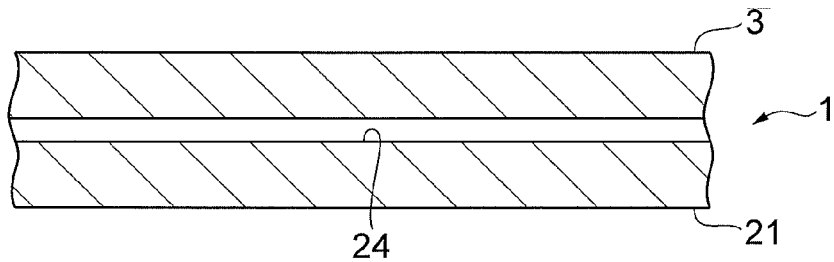
FIG. 11 (a) is a sectional view of the object illustrating a sequel to FIG. 10(b), (b) is a sectional view of the object illustrating a sequel to FIG. 11(a), (c) is a sectional view of the object illustrating a sequel to FIG. 11(b), and (d) is a sectional view of the object illustrating a sequel to FIG. 11(c)
Figure 11:
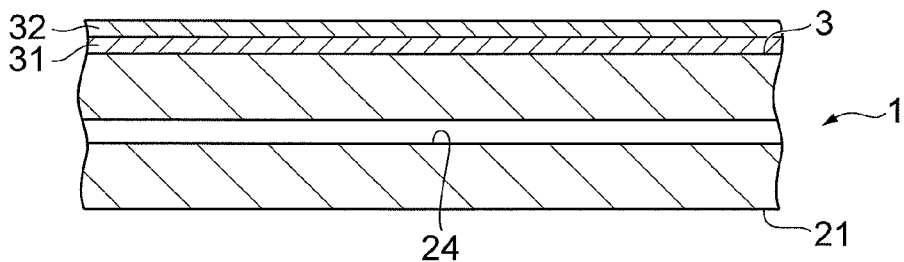
Figure 11:
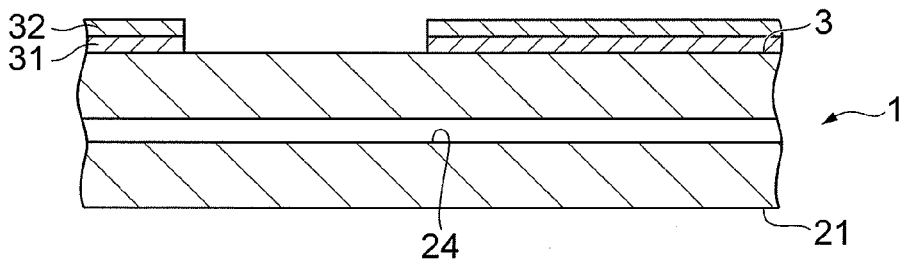
Figure 11:
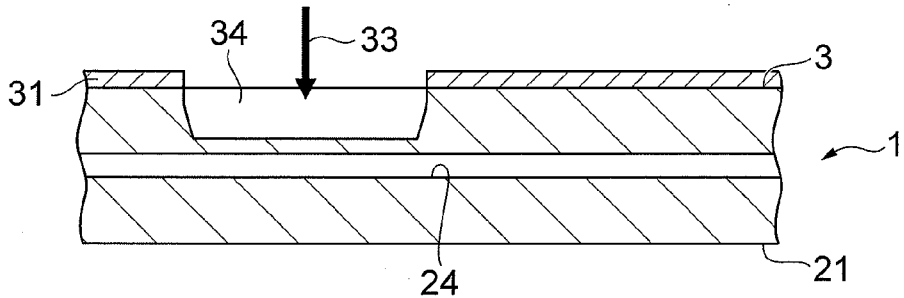
Figure 13:
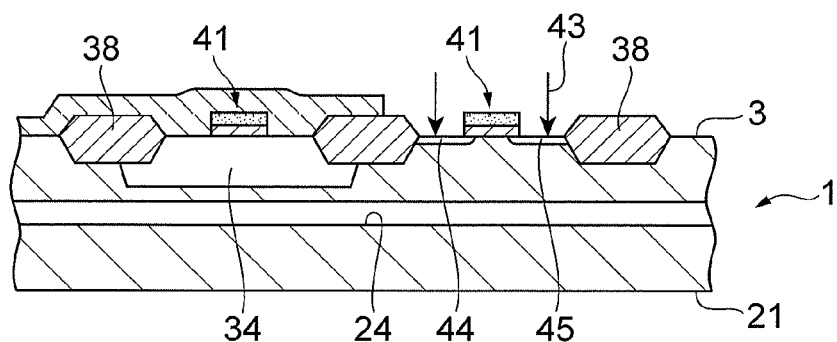
FIG. 13 (a) is a sectional view of the object illustrating a sequel to FIG. 12(d), (b) is a sectional view of the object illustrating a sequel to FIG. 13(a), (c) is a sectional view of the object illustrating a sequel to FIG. 13(b), and (d) is a sectional view of the object illustrating a sequel to FIG. 13(c)
Figure 13:
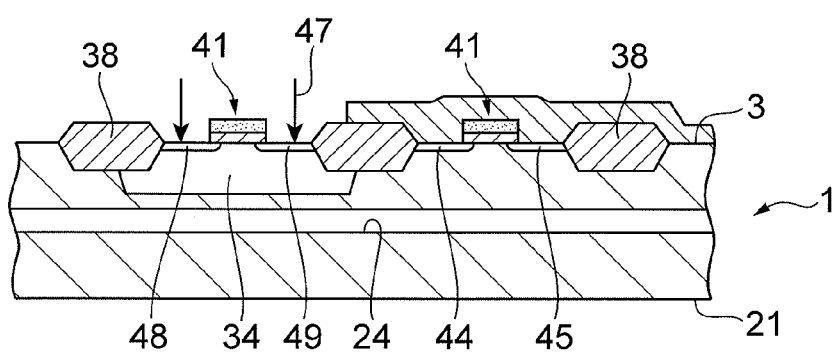
Figure 13:
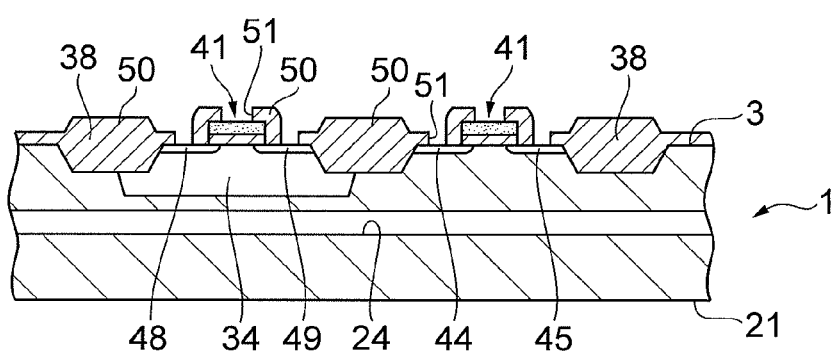
Figure 13:
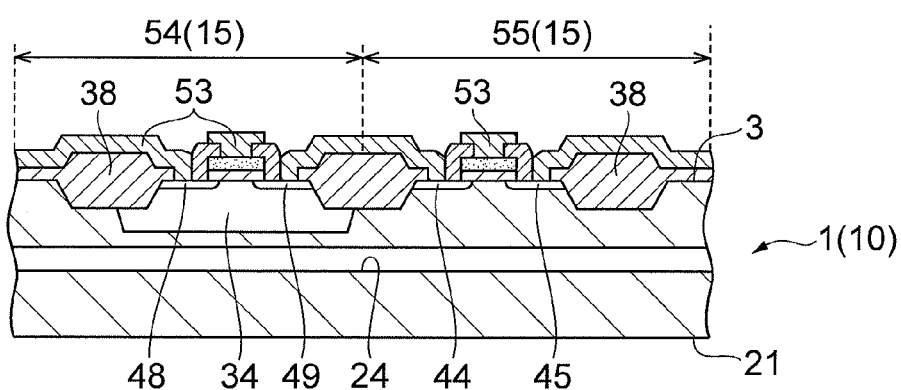

This embodiment is used for manufacturing semiconductor devices (silicon devices) such as CPU (Central Processing Unit) and high-power transistors and manufactures a CMOS (Complementary Metal Oxide Semiconductor) sensor formed by mounting functional devices 15 on the object 1 here as illustrated in FIG. 13. In particular, as illustrated in FIG. 10, this embodiment performs three-dimensional fine processing within the object 1 so as to form a micro-flow path (flow path) 24 constituted by a micropore through which a coolant circulates as a cooling mechanism within the object 1. Here, at the center position in the thickness direction within the object 1, the micro-flow path 24 extends in a wavy form winding such as to turn around along one direction and advancing in a direction orthogonal to the one direction when seen from the front face 3.

The object 1 is a silicon substrate transparent to the wavelength (e.g., 1064 nm) of the laser light L with which it is irradiated. Here, the object 1 is a p-type silicon substrate having the front face (one main face) 3 and rear face (the other main face) 21, which are (100) planes. In the object 1, a line to form a modified region is programmably set as being specified by three-dimensional coordinates.

The line is set so as to extend in conformity to the micro-flow path 24 to be formed. That is, the line is set into a wavy form winding such as to turn around along one direction and advancing in a direction orthogonal to the one direction when seen from the front face 3. Examples of the functional devices 15 include semiconductor operating layers formed by crystal growth, light-receiving devices such as photodiodes, light-emitting devices such as laser diodes, and circuit devices formed as circuits.

Figure 8:
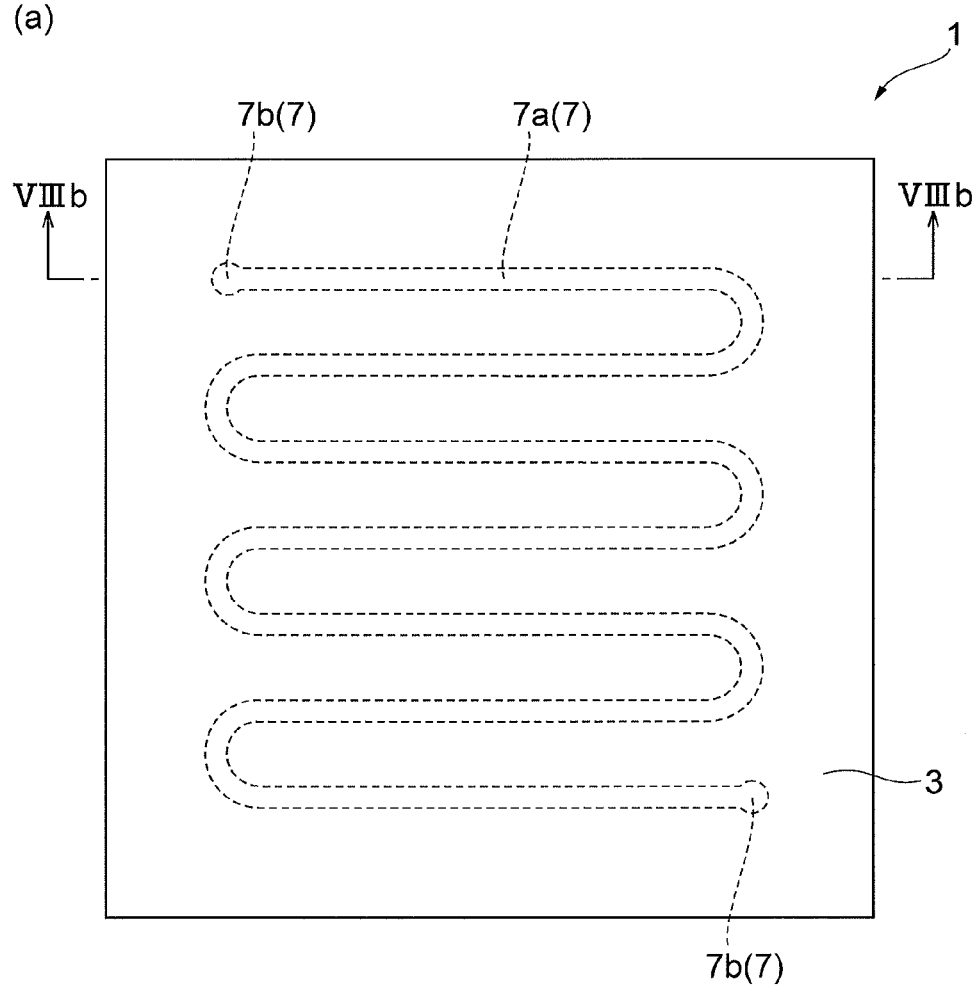
FIG. 8 (*a*) is a plan view illustrating the object for explaining a flow of the method for manufacturing a semiconductor device in accordance with the first embodiment, while (*b*) is a sectional view of the object taken along the line VIIIb-VIIIb of FIG. 8(*a*)
Figure 8:
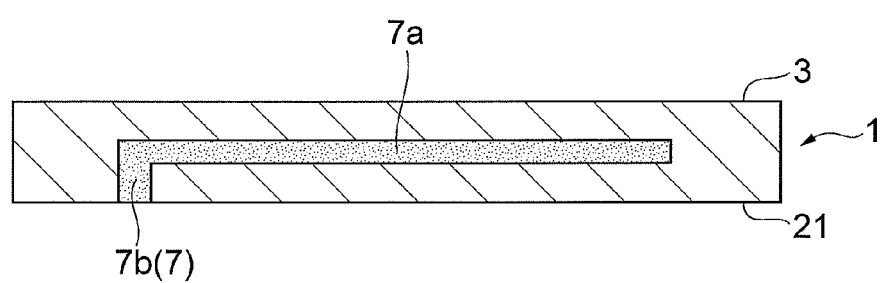
Figure 9:
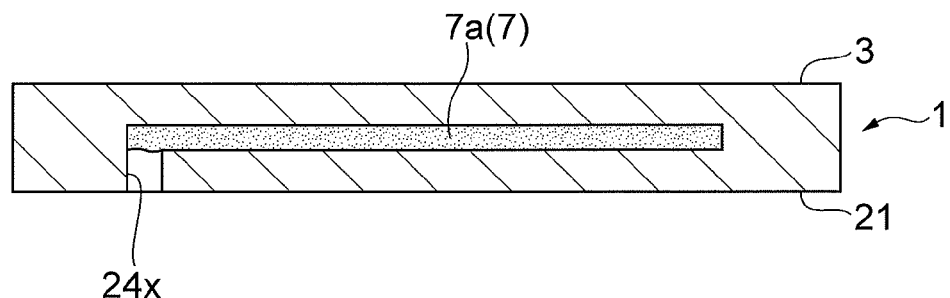
FIG. 9 (a) is a sectional view of the object illustrating a sequel to FIG. 8(b), (b) is a sectional view of the object illustrating a sequel to FIG. 9(a), and (c) is a sectional view of the object illustrating a sequel to FIG. 9(b)
Figure 9:
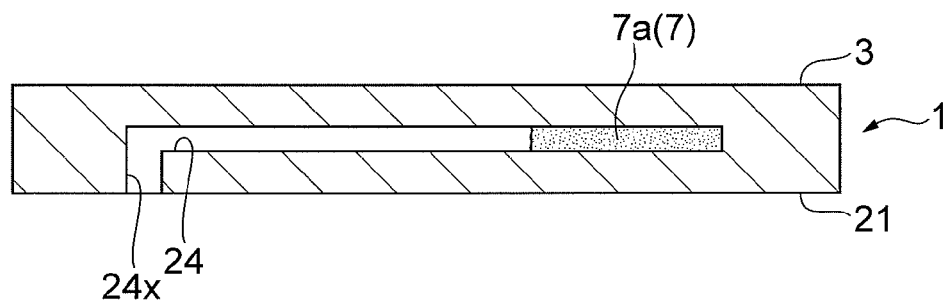
Figure 9:
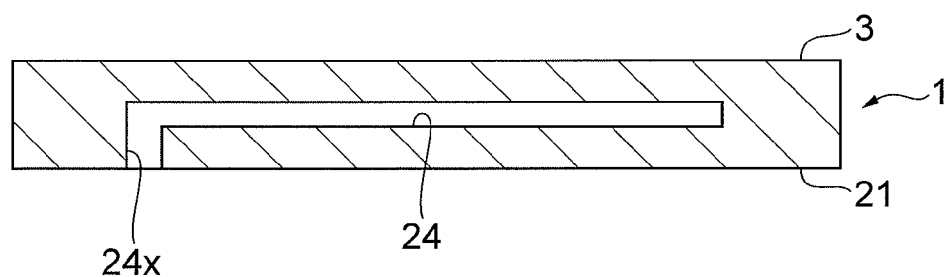

First, when processing the object 1 in this embodiment, the laser light L is converged at the object 1, so as to form modified regions 7 within the object 1 (S1 in FIG. 7). Specifically, the object 1 is mounted and held on the mount table with the front face 3 facing up. Then, the object 1 is irradiated with the laser light L from the front face 3 side while locating a converging point of the laser light L (hereinafter simply referred to as "converging point") at a center part in the thickness direction within the object 1 and moving the converging point along the line to form a modified region. This forms a continuous modified region 7a (i.e., a wavy modified region 7 winding such as to turn around when seen from the front face 3) only within the object 1 along the micro-flow path 24 (see FIG. 10) to be formed as illustrated in FIG. 8.

Also, the object 1 is irradiated with the laser light L from the front face 3 side while locating the converging point at one end of the line and moving the converging point to the rear face 21 in the thickness direction. Further, the object 1 is irradiated with the laser light L from the front face 3 side while locating the converging point at the other end of the line and moving the converging point to the rear face 21 in the thickness direction. This forms modified regions 7b, 7b which are exposed to the rear face 21 and continuous with the respective ends of the modified region 7a along the thickness direction as those constituting inlet/outlet parts 24x (see FIG. 9) of the micro-flow path 24.

Here, since spot irradiation is performed with a pulsed laser light as the laser light L, the resulting modified regions 7 are constituted by modified spots. Thus formed modified regions 7 include fractures generated from the modified regions 7 (ditto in the following modified regions 7).

Next, the object 1 is anisotropically etched with KOH at 85° C., for example, employed as an etchant (S2 in FIG. 7). This lets the etchant proceed and infiltrate from the rear face 21 into the modified regions 7b, so as to advance the etching along the modified regions 7b and remove the object 1, thereby forming the inlet/outlet parts 24x. Then, as illustrated in FIGS. 9(b) and 9(c), the etchant proceeds and infiltrates from the modified regions 7b into the modified region 7a, so as to advance the etching along the modified region 7a and remove the object 1, thereby completing the forming of the micro-flow path 24 as illustrated in FIG. 10.

Afterward, the functional devices 15 are formed on the front face 3 side of the object (S3 in FIG. 7). Specifically, as illustrated in FIGS. 11(a) and 11(b), the object 1 is washed, dried, and then thermally oxidized so as to grow a silicon dioxide film 31 ($SiO_2$) on the front face 3, and a photoresist 32 which is a photosensitive resin film is applied onto the silicon dioxide film 31. Subsequently, as illustrated in FIG. 11(c), the photoresist 32 is patterned by photolithography, and the silicon dioxide film 31 is etched away through the photoresist 32 acting as a mask, so as to expose a predetermined part of the front face 3 of the object 1.

Next, as illustrated in FIG. 11(d), after removing the photoresist 32 and washing the remainder, phosphorus ions 33 are injected onto the front face 3 through the silicon dioxide film 32 acting as a mask, so as to form an N-type region 34 having a predetermined distribution on the front face 3 side of the object 1. Subsequently, as illustrated in FIG. 12(a), the silicon dioxide film 31 is dissolved away, the remainder is washed, and a pad film 35 ($SiO_2$), a silicon nitride film 36 ($Si_3N_4$), and a photoresist 37 are formed on the front face 3 in this order. Then, the photoresist 37 is patterned by photolithography, and thereafter the pad film 35 and silicon nitride film 36 are etched away through the photoresist 37 acting as a mask, so as to expose a predetermined part of the front face 3 of the object 1.

Figure 12:
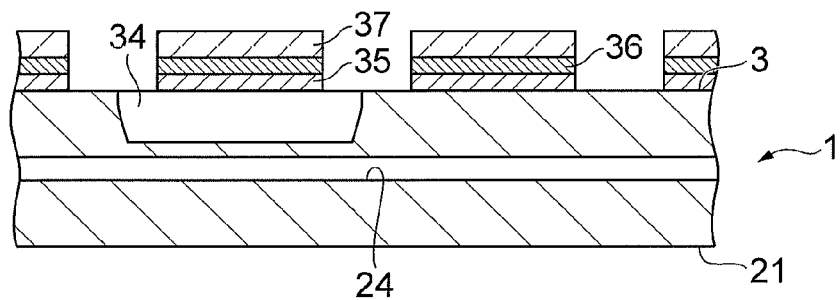
FIG. 12 (a) is a sectional view of the object illustrating a sequel to FIG. 11(d), (b) is a sectional view of the object illustrating a sequel to FIG. 12(a), (c) is a sectional view of the object illustrating a sequel to FIG. 12(b), and (d) is a sectional view of the object illustrating a sequel to FIG. 12(c)
Figure 12:
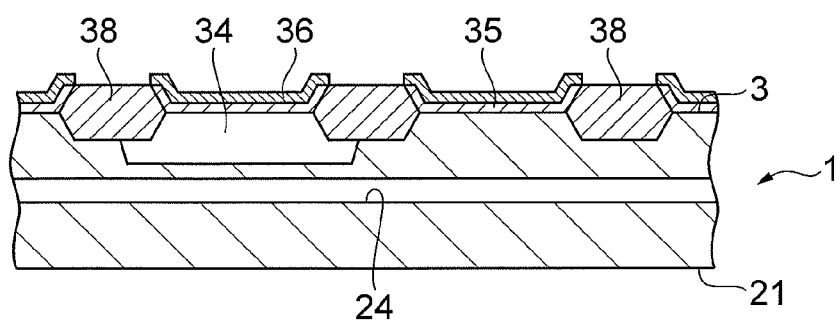
Figure 12:
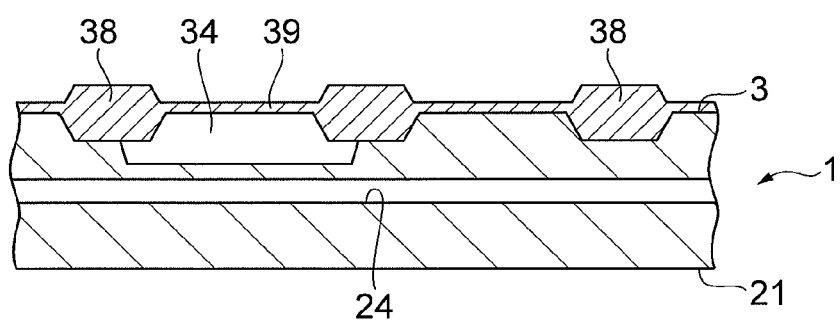
Figure 12:
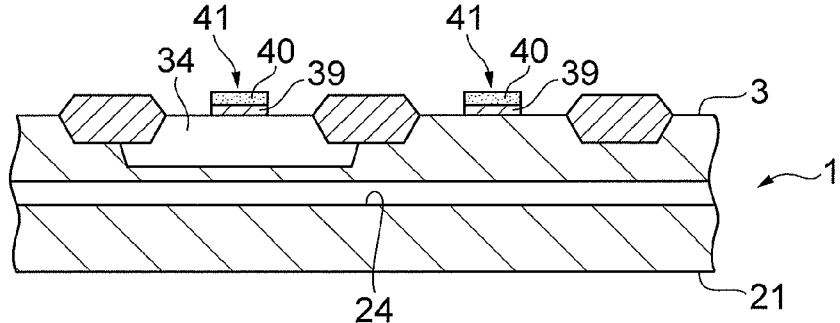

Afterward, as illustrated in FIG. 12(*b*), the photoresist 37 is peeled off, the remainder is washed, and then a field film 38 (SiO$_2$) is partly formed on the front face 3 side of the object 1 through the silicon nitride film 36 acting as a mask. Subsequently, as illustrated in FIG. 12(*c*), the pad film 35 and silicon nitride film 36 are removed, the remainder is washed, and then a gate film 39 (SiO$_2$) is grown by thermal oxidation. Thereafter, as illustrated in FIG. 12(*d*), a polycrystal silicon film 40 is deposited on the front face 3 and patterned by photolithography, so as to form gate electrodes 41, and then the gate film 39 is etched away through the gate electrodes 41 employed as a mask.

Next, as illustrated in FIG. 13(*a*), while the p-channel transistor side (depicted left side) is covered with a resist film 42, arsenic 43 is injected into the n-channel transistor side (depicted right side), so as to form a source region 44 and a drain region 45 on the front face 3 of the object 1. On the other hand, as illustrated in FIG. 13(*b*), while the n-channel transistor side is covered with a resist film 46, boron 47 is injected into the p-channel transistor side, so as to form a source region 48 and a drain region 49 on the front face 3 of the object 1.

Then, as illustrated in FIG. 13(*c*), an interlayer insulating film 50 (SiO$_2$) is deposited on the front face 3 and patterned by photolithography, so as to form electrode outlets 51. Finally, as illustrated in FIG. 13(*d*), an aluminum film is deposited on the front face 3 and patterned by photolithography, so as to form conductive parts 53. As a consequence, a CMOS sensor comprising a p-channel transistor 54 and an n-channel transistor 55 as functional devices 15 on the front face 3 side is formed as a semiconductor device 10. Thereafter, the semiconductor device 10 is electrically connected onto a circuit board through solder balls, for example.

As in the foregoing, this embodiment forms a continuous modified region 7 unexposed to the front face 3 and rear face 21 within the object 1, which is a silicon substrate, and anisotropically etches away the modified region 7, so as to produce the micro-flow path 24 through which a coolant can flow within the semiconductor device 10. This yields a semiconductor device which can integrally form the micro-flow path 24 within the object 1 and can directly be cooled without separately providing cooling means. Hence, this embodiment can manufacture the semiconductor device 10 capable of improving the cooling efficiency and reducing the size.

Since there are cases where doping the etchant with additives changes the etching rate in a specific crystal orientation, the etchant may be doped with an additive corresponding to the crystal orientation of the object 1 in order to perform anisotropic etching at a desirable etching rate.

The second embodiment will now be explained. This embodiment will be explained mainly in terms of differences from the above-mentioned first embodiment.

Figure 14:
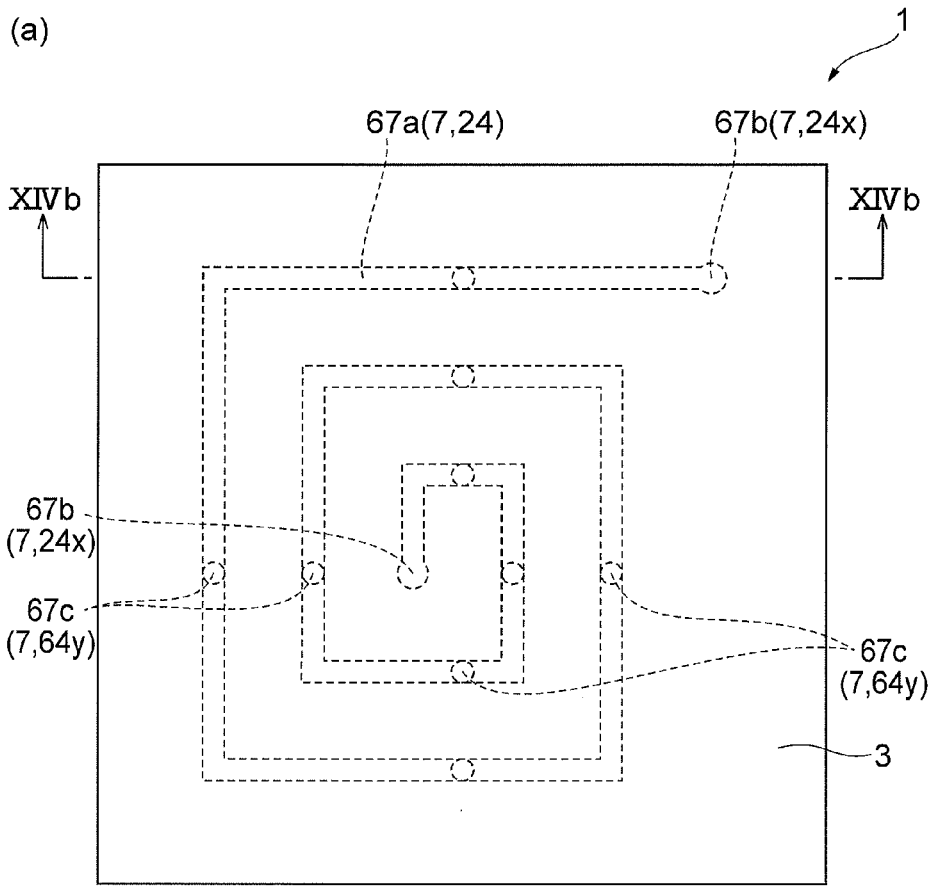
FIG. 14 (a) is a plan view illustrating the object for explaining a flow of the method for manufacturing a semiconductor device in accordance with a second embodiment, while (b) is a sectional view of the object taken along the line XIVb-XIVb of FIG. 14(a)
Figure 14:
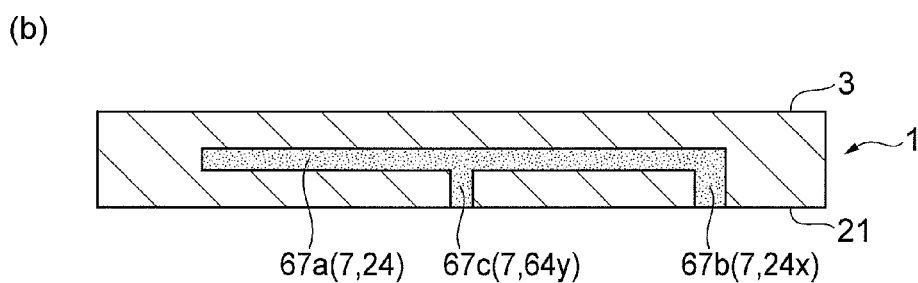
Figure 15:
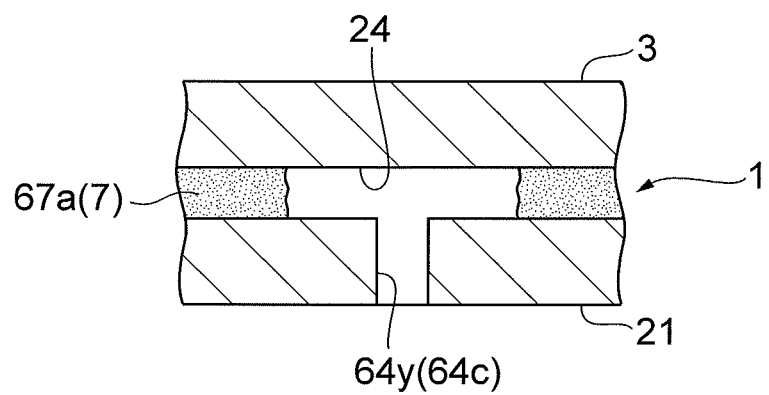
FIG. 15 is an enlarged sectional view of the object illustrating a sequel to FIG. 14(b)

FIG. 14 is a view for illustrating the object for explaining this embodiment, while FIG. 15 is an enlarged sectional view of the object for explaining the anisotropic etching in this embodiment. This embodiment differs from the above-mentioned first embodiment in that a micro-flow path extending like a rectangular spiral when seen from the front face 3 is formed as a cooling mechanism within the object 1 in place of the micro-flow path 24 (see FIG. 10) extending in a wavy form when seen from the front face 3.

Specifically, the laser light L is initially converged into the object 1 such that a modified region 67*a* extending like a rectangular spiral from the center of the object 1 when seen from the front face 3 is formed only within the object 1 as illustrated in FIG. 14. Also, modified regions 67*b* exposed to the rear face 21 while being continuous with the respective ends of the modified region 67*a* are formed along the thickness direction as those constituting inlet/outlet parts of the micro-flow path.

In addition, this embodiment converges the laser light L into the object 1 such that a plurality of modified regions 67*c* are formed in the object 1 as those guiding the etchant to the modified region in anisotropic etching in a later stage. Each of the modified regions 67*c* extends in the thickness direction of the object 1 such as to be exposed to the rear face 21 while being continuous with the modified region 67*a* in the middle thereof. In other words, each of the modified regions 67*c* continuously extends from a predetermined position in the middle (between both ends) of the modified region 67*a*, which is formed continuously in a direction along the front face 3 within the object 1, to the rear face 21 along the thickness direction.

Next, the object 1 is anisotropically etched. This lets the etchant progress and infiltrate from the rear face 21 into the modified regions 67*b* in the object 1, thereby advancing the etching along the modified regions 67*b*. Subsequently, the etchant progresses and infiltrates from the modified regions 67*b* into the modified region 67*a*, thereby advancing the etching along the modified region 67*a*. Also, as illustrated in FIGS. 14 and 15, this embodiment lets the etchant progress and infiltrate from the rear face 21 into the modified regions 67*c*, so as to advance the etching along the modified regions 67*c*, and from the modified regions 67*c* into the modified region 67*a*, thereby developing the etching along the modified region 67*a*.

As in the foregoing, this embodiment also yields the above-mentioned operation and effect of manufacturing the semiconductor device 10 capable of improving the cooling efficiency and reducing the size.

As mentioned above, this embodiment forms the modified regions 67*c* in the object 1 exposed to the rear face 21 while being continuous with the modified region 67*a* in the middle thereof, and advances the etching selectively along the modified regions 67*c*, thereby causing the etchant to progress from the modified regions 67*c* to the modified region 67*a*. Therefore, when forming a micro-flow path by etching along the modified region 67*a*, the progress (etching rate) in etching the modified region 67*a* can be controlled by the modified regions 67*c* as desired.

Corner portions of the rectangular spiral in the modified region 67*a* in the object 1 may have (111) planes such as to be chamfered when seen from the front face 3. In this case, the etch stops at the (111) planes in the anisotropic etching in the later stage, so that the corner portions of the rectangular spiral in the micro-flow path become smoother by chamfering, whereby the circulation of the coolant in the micro-flow path can be improved.

There is a case where holes 64*y* (see FIGS. 14 and 15) formed by developing the etching along the modified regions 67*c* are filled after the anisotropic etching in this embodiment. This can suppress adverse effects on products and the like caused by the holes 64*y* in the resulting semiconductor device 10.

The third embodiment will now be explained. This embodiment will be explained mainly in terms of differences from the above-mentioned second embodiment.

Figure 16:
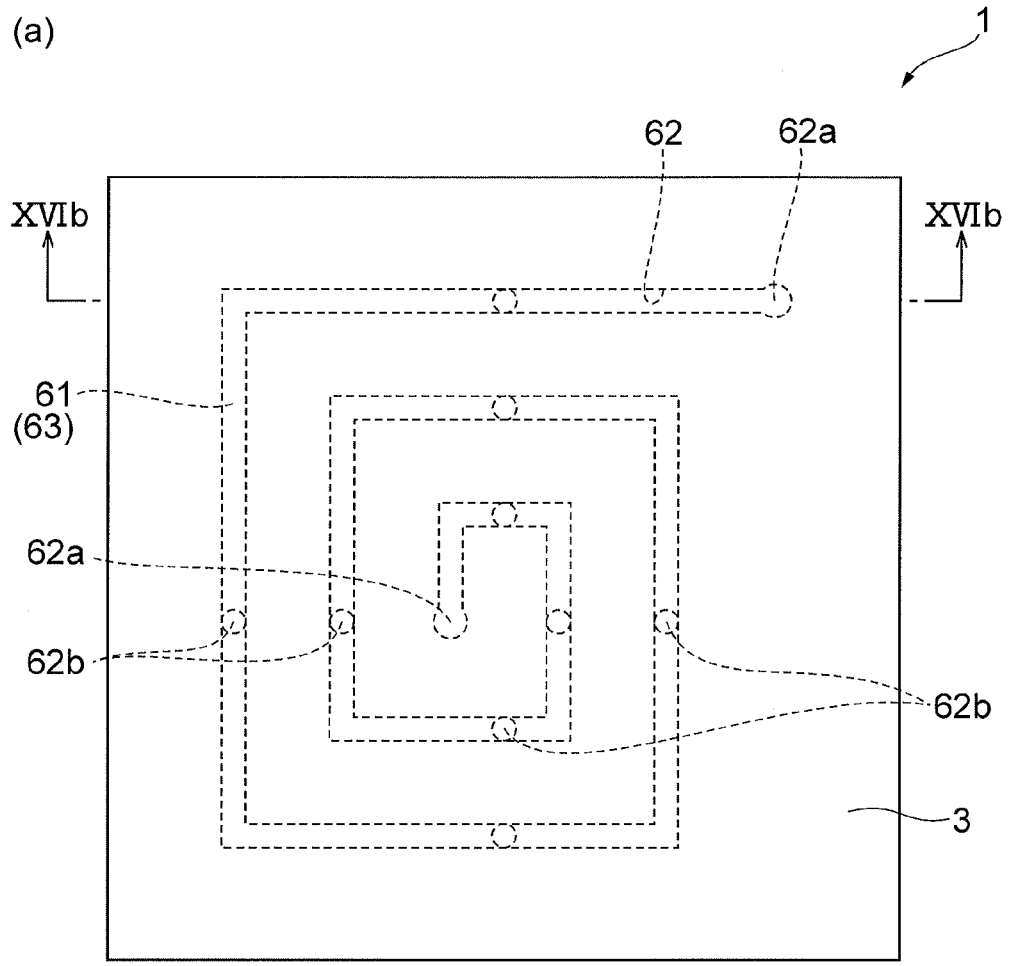
FIG. 16 (a) is a plan view illustrating the object for explaining a flow of the method for manufacturing a semiconductor device in accordance with a third embodiment, while (b) is a sectional view of the object taken along the line XVIb-XVIb of FIG. 16(a).
Figure 16:
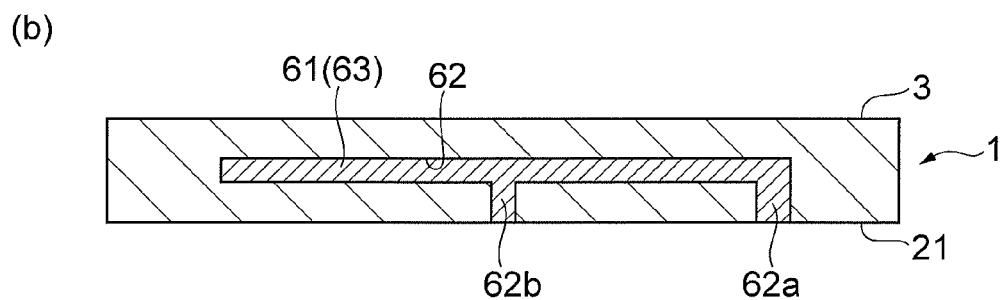

FIG. 16 is a view for illustrating the object for explaining this embodiment. this embodiment performs anisotropic etching so as to advance the etching selectively along the modified region 7 after forming the modified region 7 (see FIGS. 14). Therefore, a space 62 extending like a rectangular spiral when seen from the front face 3 is formed within the object 1 as illustrated in FIG. 16. Inlet/outlet parts 62a, 62b are formed along with the above-mentioned embodiments at the space 62. Next, the space 62 is filled with a coolant 61 by electroless deposition. Therefore, a cooling mechanism 63 is formed within the object 1. Subsequently, the functional devices 15 are formed on the front face 3 side of the object 1 along with the above-mentioned embodiments.

Examples of the coolant 61 include highly heat-conductive material, for example, Cu, Al or the like, other metallic material. The cooling mechanism 63 cools the semiconductor device by cooling the coolant 61 form outside.

As in the foregoing, this embodiment also yields the above-mentioned operation and effect of manufacturing the semiconductor device capable of improving the cooling efficiency and reducing the size. In this embodiment, the functional devices 15 may be formed after forming the space 62 and before filling with the coolant 61.

Though preferred embodiments of the present invention have been explained in the foregoing, the present invention is not limited thereto but may be modified or applied to others within the scope not changing the gist recited in each claim.

For example, the laser light entrance surface for forming the modified regions 7 is not limited to the front face 3 of the object 1, but may be the rear face 21 of the object 1. Though the above-mentioned second embodiment forms a plurality of modified regions 67c for guiding the etchant to the modified region 67a in the object 1, modified regions similar to the modified regions 67c may be formed in the above-mentioned first embodiment as appropriate. This can favorably guide the etchant to the modified region 7a, thereby controlling the progress in etching along the modified region 7a as desired.

Though the above-mentioned embodiments produce the functional devices 15 after forming the modified regions 7 and performing the anisotropic etching, the anisotropic etching may be performed after forming the functional devices 15 and the modified regions 7 in this order or in reverse order. In these cases, the functional devices 15 are protected by a protective film or the like after being formed. The flow paths may have various shapes as long as they are formed within the object 1.

INDUSTRIAL APPLICABILITY

The present invention can manufacture a semiconductor device capable of improving the cooling efficiency and reducing the size.

REFERENCE SIGNS LIST

1 . . . object; 3 . . . front face (one main face); 5 . . . line to form a modified region; 7, 7a, 7b, 67a to 67c . . . modified region; 10 . . . semiconductor device; 15 . . . functional device; 21 . . . rear face (other main face); 24 . . . micro-flow path (flow path); 61 . . . coolant; 62 . . . space; 64y . . . hole; L . . . laser beam.

The invention claimed is:

1. A method for manufacturing a semiconductor device having a cooling mechanism, the method comprising:
a modified region forming step of converging a laser light at a sheet-like object to be processed made of silicon so as to form a first modified region within the object along a line to form a modified region;
an etching step of anisotropically etching the object after the modified region forming step so as to advance the etching selectively along the first modified region and form a flow path for circulating a coolant as a cooling mechanism within the object; and
a functional device forming step of forming a functional device on one main face side of the object by performing oxidized film formation, photoresist formation, photolithography, ion injection and conductive part formation on the object to be formed or being formed with the cooling mechanism.

2. A method for manufacturing a semiconductor device according to claim 1, wherein the modified region forming step forms a second modified region exposed to the other main face opposite from the one main face in the object along a thickness direction of the object such that the second modified region is continuous with the first modified region in the middle thereof; and
wherein the etching step advances the etching selectively along the second modified region so that an etchant proceeds from the second modified region to the first modified region.

3. A method for manufacturing a semiconductor device according to claim 2, further comprising a step of closing a hole formed by advancing the etching along the second modified region.

4. A method for manufacturing a semiconductor device according to claim 3, wherein the functional device forming step is performed after the etching step.

5. A method for manufacturing a semiconductor device according to claim 2, wherein the functional device forming step is performed after the etching step.

6. A method for manufacturing a semiconductor device according to claim 1, wherein the functional device forming step is performed after the etching step.

7. A method for manufacturing a semiconductor device having a cooling mechanism, the method comprising:
a modified region forming step of converging a laser light at a sheet-like object to be processed made of silicon so as to form a first modified region within the object along a line to form a modified region;
an etching step of anisotropically etching the object after the modified region forming step so as to advance the etching selectively along the first modified region and form a space for filling with a coolant within the object;
a step of filling the space with the coolant so as to forming a cooling mechanism in the object; and
a functional device forming step of forming a functional device on one main face side of the object by performing oxidized film formation, photoresist formation, photolithography, ion injection and conductive part formation on the object to be formed or being formed with the cooling mechanism.

8. A method for manufacturing a semiconductor device according to claim 7, wherein the modified region forming step forms a second modified region exposed to the other main face opposite from the one main face in the object along a thickness direction of the object such that the second modified region is continuous with the first modified region in the middle thereof; and
wherein the etching step advances the etching selectively along the second modified region so that an etchant proceeds from the second modified region to the first modified region.

9. A method for manufacturing a semiconductor device according to claim 8, further comprising a step of closing, a hole formed by advancing the etching along the second modified region.

10. A method for manufacturing a semiconductor device according to claim 9, wherein the functional device forming step is performed after the etching step.

11. A method for manufacturing a semiconductor device according to claim 8, wherein the functional device forming step is performed after the etching step.

12. A method for manufacturing a semiconductor device according to claim 7, wherein the functional device forming step is performed after the etching step.

* * * * *